(12) United States Patent
Simons

(10) Patent No.: US 11,550,008 B2
(45) Date of Patent: Jan. 10, 2023

(54) GENERATION OF RF PULSES FOR MRI APPLICATIONS

(71) Applicant: KONINKLIJKE PHILIPS N.V., Eindhoven (NL)

(72) Inventor: Jan Simons, Best (NL)

(73) Assignee: Koninklijke Philips N.V., Eindhoven (NL)

( * ) Notice: Subject to any disclaimer, the term of this patent is extended or adjusted under 35 U.S.C. 154(b) by 29 days.

(21) Appl. No.: 17/286,828

(22) PCT Filed: Oct. 21, 2019

(86) PCT No.: PCT/EP2019/078480
§ 371 (c)(1),
(2) Date: Apr. 20, 2021

(87) PCT Pub. No.: WO2020/083802
PCT Pub. Date: Apr. 30, 2020

(65) Prior Publication Data
US 2021/0382125 A1 Dec. 9, 2021

(30) Foreign Application Priority Data
Oct. 23, 2018 (EP) .................................... 18202021

(51) Int. Cl.
*G01R 33/36* (2006.01)
(52) U.S. Cl.
CPC ............................... *G01R 33/3614* (2013.01)
(58) Field of Classification Search
CPC .................................................. G01R 33/3614
See application file for complete search history.

(56) References Cited

U.S. PATENT DOCUMENTS

| 6,072,315 A | 6/2000 | Slade |
|---|---|---|
| 2015/0054509 A1 | 2/2015 | Smits et al. |

(Continued)

FOREIGN PATENT DOCUMENTS

EP 2893876 A1 7/2015

OTHER PUBLICATIONS

International Search Report and Written Opinion from PCT/EP2019/078480 dated Apr. 30, 2020.

*Primary Examiner* — Susan S Lee

(57) ABSTRACT

The invention relates to the generation of RF pulses for MRI applications. According to the invention, a RF transmitter for a MRI system (1) is provided which comprises a RF amplifier (9) for generating RF pulses and for forwarding these RF pulses to a RF transmit coil (5) of the MRI system (1), a capacitor bank (10) coupled to the RF amplifier (9), for storing electric energy and for providing the RF amplifier (9) with a current for generating the RF pulses, a mains power supply (11) coupled to the capacitor bank (10), for generating a charging current for charging the capacitor bank (10) with electric energy, and a power supply control unit (12) coupled to the mains power supply (11), for controlling the generation of the charging current for the capacitor bank (10), wherein the power supply control unit (12) is adapted for receiving an indication signal indicating the actual and/or the upcoming current drawn from the capacitor bank (10) and for controlling the generation of the charging current for the capacitor bank (10) on the basis of the indication signal. In this way, the generation of RF pulses for MRI applications becomes more efficient making it possible to use smaller capacitor bank values at the same performance level.

12 Claims, 5 Drawing Sheets

(56) References Cited

U.S. PATENT DOCUMENTS

| | | | |
|---|---|---|---|
| 2016/0025798 A1* | 1/2016 | Takagi | G01R 35/00 324/546 |
| 2017/0176555 A1 | 6/2017 | Kawajiri et al. | |
| 2017/0261573 A1 | 9/2017 | Nakamura et al. | |
| 2017/0285119 A1 | 10/2017 | Kanakasabai et al. | |

* cited by examiner

GENERATION OF RF PULSES FOR MRI APPLICATIONS

CROSS REFERENCE TO RELATED APPLICATIONS

This application is a U.S. national phase application of International Application No. PCT/EP2019/078480 filed on Oct. 21, 2019, which claims the benefit of EP Application Serial No. 18202021.4 filed on Oct. 23, 2018 and is incorporated herein by reference.

FIELD OF THE INVENTION

The invention relates to the field of magnetic resonance imaging (MRI) and in particular to a RF (radio frequency) transmitter for a MRI system comprising a RF transmitter for generating RF pulses and for forwarding these RF pulses to a RF transmit coil of the MRI system. In addition to the RF amplifier, the RF transmitter contains a capacitor bank coupled to the RF amplifier, for storing electric energy and for providing the RF amplifier with current for generating the RF pulses, and a mains power supply coupled to the capacitor bank, for generating a charging current for charging the capacitor bank with electric energy. The invention also relates to a method for generating RF pulses for a MRI system with a RF transmitter, the RF transmitter comprising a mains power supply, a capacitor bank and a RF amplifier, the method comprising the following method steps: generating a charging current in the mains power supply and charging the capacitor bank with the charging current, providing the RF amplifier with a current by the capacitor bank for generating the RF pulses, and generating RF pulses in the RF amplifier and forwarding these RF pulses to a RF transmit coil of the MRI system.

BACKGROUND OF THE INVENTION

Current RF amplifiers in magnetic resonance imaging applications utilize a large capacitor bank to store the pulse energy required to be generated. These RF amplifiers typically comprise a mains power supply, a capacitor bank for energy storage and a RF amplifier which uses the stored energy. The capacitor bank is usually recharged between pulses from the mains power supply. In general, the RF transmission happens in very short pulses with significant time in between where gradient fields are manipulated and or RF signals are being received.

The mains power supply that charges the capacitor banks in RF amplifiers often uses switched mode power supply techniques. The switched mode power supply starts recharging the capacitor bank when the capacitor bank voltage is below a threshold voltage. The charging current is limited in the power supply and some control algorithm may be added to limit the charging current in cases where the capacitor bank voltage is only slightly below the threshold voltage. The recharging therefore starts with some delay with respect to the initiation of the discharge by the RF amplifier. Hence, the full power supply current is not available during short high power RF pulses.

US 2017/261573 A1 describes that a magnetic resonance imaging apparatus includes an amplifier, a capacitor bank, and processing circuitry. The amplifier supplies, based on an imaging sequence, an RF pulse to an RF coil which generates a radio frequency magnetic field. The capacitor bank supplies an electric power to the amplifier. The processing circuitry judges whether an imaging by the imaging sequence is able to be executed, based on a condition of the RF pulse in the imaging sequence and an output efficiency of the amplifier.

SUMMARY OF THE INVENTION

It is an object of the invention to make the generation of RF pulses for MRI applications more efficient.

According to the invention, this object is addressed by the subject matter of the independent claims. Preferred embodiments of the invention are described in the sub claims.

Therefore, according to the invention, a RF transmitter for a MRI system is provided which comprises:

a RF amplifier for generating RF pulses and for forwarding these RF pulses to a RF transmit coil of the MRI system, a capacitor bank coupled to the RF amplifier, for storing electric energy and for providing the RF amplifier with a current for generating the RF pulses, a mains power supply coupled to the capacitor bank, for generating a charging-current for charging the capacitor bank with electric energy, and a power supply control unit coupled to the mains power supply, for controlling the generation of the charging current for the capacitor bank, wherein the power supply control unit is adapted for receiving an indication signal indicating the actual and/or the upcoming current drawn from the capacitor bank and for controlling the generation of the charging current for the capacitor bank on the basis of the indication signal.

Hence, the present invention addresses the power supply control for a MRI RF transmitter by using extra information. This information may be used in such a way that the recharging current to the capacitor bank may be activated even though the voltage drop is still very small. This would allow for a smaller capacitor bank value at the same performance level. According to the invention, there are different possibilities for determining when the capacitor bank recharging current should start and how big it should be.

In this respect, according to a preferred embodiment of the invention, a capacitor bank current sensor is provided which is coupled to the capacitor bank and which is adapted for measuring the actual current drawn from the capacitor bank and for generating the indication signal on the basis of this current. In this way, the control of the charging current fed from the mains power supply to the capacitor bank is directly influenced by the actual current drawn from the capacitor bank. In other words: The actual current drawn from the capacitor bank directly triggers a respective recharging of the capacitor bank.

In addition or as an alternative, according to a preferred embodiment of the invention, a RF amplifier power sensor is provided which is coupled to the RF amplifier and which is adapted for measuring the actual RF power generated in the RF amplifier which can form the basis for calculating the current draw. According to this preferred embodiment of the invention the actual RF power generated in the RF amplifier triggers the recharging of the capacitor bank.

In general, it is possible that the RF amplifier is only coupled to the capacitor bank for feeding a current to the RF amplifier. However, according to a preferred embodiment of the invention, the RF amplifier is also directly coupled to the mains power supply for directly drawing a current from the mains power supply. It is desirable that the current from the mains power supply is available during the largest part of the RF pulse. Therefore, according to this preferred embodiment of the invention, not only the current from the capacitor bank but also the current directly obtained from the mains power supply may be used to generate RF power in the RF amplifier. This would also allow for a smaller capacitor bank value at the same performance level.

For the mains power supply, the invention allows for different types of power supplies. However, according to a preferred embodiment of the invention, the mains power supply is a switched mode power supply.

The invention also relates to a MRI system with a RF transmitter as described above. In this respect, according to a preferred embodiment of the invention, the MRI further comprises a transmit coil and an information unit coupled to the power supply control unit and being adapted for generating the indication signal on the basis of the upcoming current drawn from the capacitor bank on the basis of the upcoming RF power demand for the transmit coil of the MRI system. Hence, information on the RF power demand may also be provided by the MRI system via separate communication to the power supply control unit and, thus, to the RF amplifier, informing it when and how much current will be drawn from the capacitor bank, based on and derived from the RF power demand.

The invention also relates to a method for generating RF pulses for a MRI system with a RF transmitter, the RF transmitter comprising a mains power supply, a capacitor bank and a RF amplifier, the method comprising the following method steps:

generating a charging current in the mains power supply and charging the capacitor bank with the charging current, providing the RF amplifier with a current by the capacitor bank for generating the RF pulses, generating RF pulses in the RF amplifier and forwarding these RF pulses to a RF transmit coil of the MRI system, estimating the actual and/or the upcoming current drawn from the capacitor bank, and controlling the generation of the charging current for the capacitor bank based on the estimated actual and/or the upcoming current drawn from the capacitor bank.

Preferred embodiments of the above described method relate to the preferred embodiments of the RF transmitter described further above. In this respect, preferably, the method also comprises the following method step: controlling the generation of the charging current for the capacitor bank based on the estimated upcoming current drawn from the capacitor bank in such a way that a charging current is fed to the capacitor bank directly before a RF pulse is generated and forwarded to the RF transmit coil.

In addition or as an alternative, according to a preferred embodiment of the invention, the method further comprises the method step of estimating the actual current drawn from the capacitor bank by measuring the actual current drawn from the capacitor bank.

As an alternative, the method step of measuring the actual current draw from the capacitor bank can be avoided if the actual current draw from the RF amplifier can be estimated based on different information, such as: time-varying current draw by (part of) the RF amplifier or time-varying RF amplifier output power. RF amplifier output power has a close relationship to current draw, but it also depends on other component values, such as temperature, actual bias currents in different parts of the RF amplifier, transistor efficiency and capacitor bank voltage.

According to a preferred embodiment of the invention the RF amplifier is also directly fed by a charging current from the mains power supply. As set out in detail further above, according to this preferred embodiment of the invention, not only the current from the capacitor bank but also the current directly obtained from the mains power supply may be used to generate RF power in the RF amplifier which allows for a smaller capacitor bank value at the same performance level.

Further, according to a preferred embodiment of the invention the method comprises the method step of estimating the upcoming current drawn from the capacitor bank on the basis of the upcoming RF power demand for the transmit coil of the MRI system.

It is a further preferred option of the invention to track and store the efficiency of the RF amplifier over time and to control the generation of the charging current for the capacitor bank also based on the efficiency of the RF amplifier. In this respect, extra information about the actual RF amplifier efficiency may be made use of and the RF amplifier efficiency may be tracked over time, e.g. during variation of circumstances, such as temperature, ageing and, hence, using more complete information about RF sequences from the MRI system.

The invention also relates to a non-transitory computer-readable medium, comprising instructions stored thereon, that when executed on a processor, induce s the processor system to perform a method as described before.

This invention can also be used for any application where a large energy is buffered and then drawn on a very short time scale. In such situations the energy replenishing mechanism may kick in too late. This invention combines the continuous time control algorithms—as known from power supplies—with discrete time information of other parts of the application and with the fact that the output power from the energy storage can be measured in time and value. Hence the control system can learn to precisely estimate the power draw in the system and use that for filling the energy buffer.

Further, this invention can also work in case multiple components draw power from the same energy storage as long as all power draws can be estimated reasonably accurately. For example in case of a single capacitor bank with two RF amplifier channels the power draw of each channel can be determined individually. The total power draw can be used to determine the recharging current to the capacitor bank.

BRIEF DESCRIPTION OF THE DRAWINGS

These and other aspects of the invention will be apparent from and elucidated with reference to the embodiments described hereinafter. Such an embodiment does not necessarily represent the full scope of the invention, however, and reference is made therefore to the claims and herein for interpreting the scope of the invention.

In the drawings.

DETAILED DESCRIPTION OF EMBODIMENTS

Figure 1:
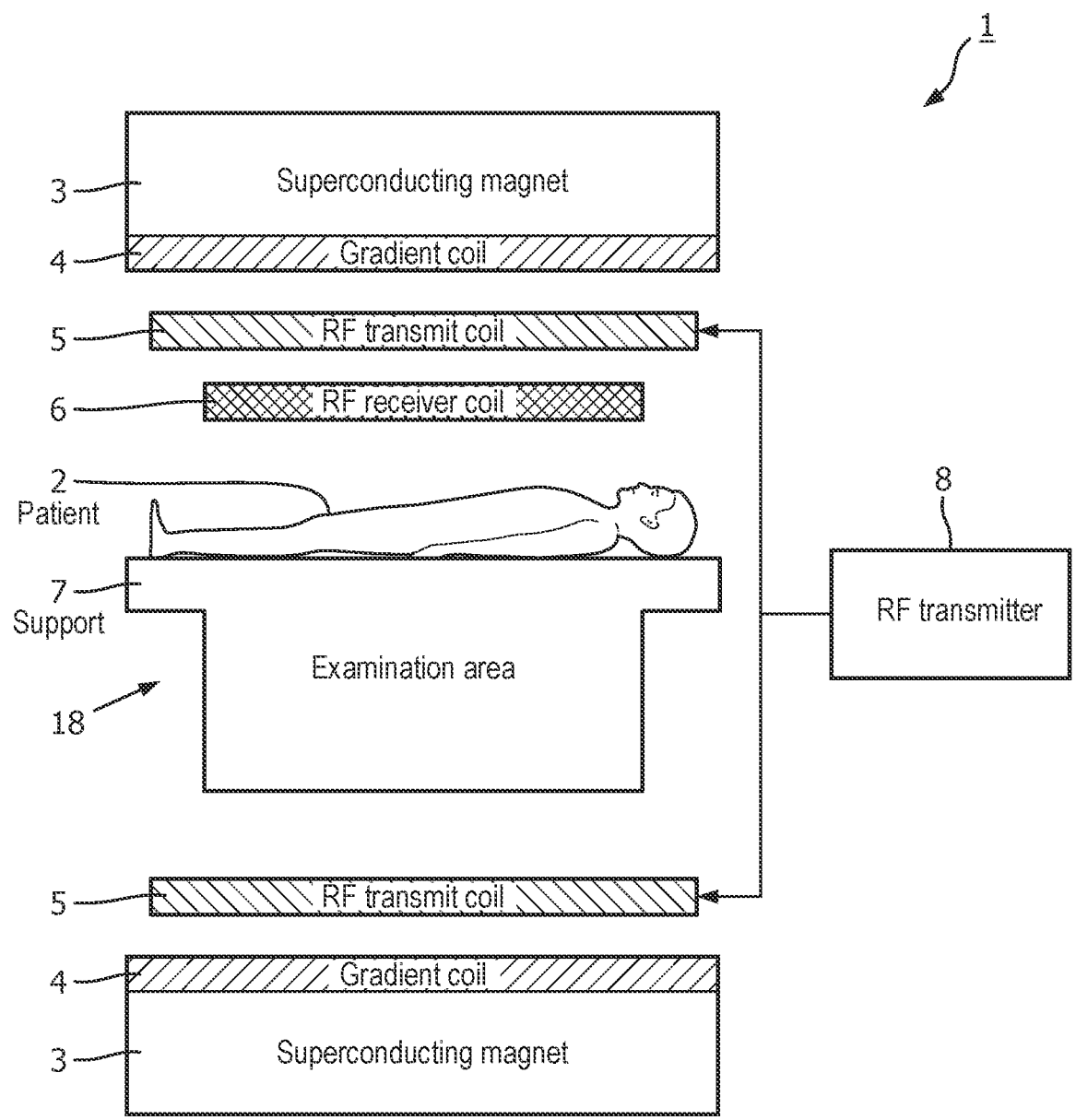
FIG. 1 schematically depicts a MRI system with a RF transmitter according to a first preferred embodiment of the invention, FIG. 2 schematically depicts the RF transmitter of the first preferred embodiment of the invention in more detail, FIG. 3 schematically depicts a RF transmitter according to a second preferred embodiment of the invention, FIG. 4 schematically depicts a RF transmitter according to a third preferred embodiment of the invention, FIG. 5 schematically depicts a MRI system with a RF transmitter according to a fourth preferred embodiment of the invention, and FIG. 6 schematically depicts the RF transmitter of the fourth preferred embodiment of the invention in more detail.

In FIG. 1 a MRI system according to a first preferred embodiment of the invention is shown. This MRI system 1 is used for MRI examination of a patient 2 in an examination area 18 within the bore of a superconducting magnet 3, which is used for generating a high static magnetic field. For positioning the patient 2 in the examination area 18, the patient 2 is positioned on a patient support 7, which may be driven into and out of the examination area 18 within the bore of the superconducting magnet 3.

Here, the MRI system 1 is only shown with its most relevant components, i.e. components which are of certain relevance for the present invention. In this respect, the MRI system 1 according to the first preferred embodiment of the invention comprises a gradient coil 4 within the bore of the superconducting magnet 3 as well as RF transmit coils 5 and a RF receiver coil 6. The RF transmit coils 5 emit RF pulses, which are supplied from a RF transmitter 8, and generate a radio frequency magnetic field within the bore of the superconducting magnet 3.

As is well known by the man skilled in the art, by transmitting RF pulses which have an orthogonal polarization to the magnetic field generated by the superconducting magnet 3 and matching the Larmor frequency of the nucleons of interest, the spins of the nucleons can be excited and brought into phase, and a deflection of their net magnetization from the direction of the field of the superconducting magnet 3 is obtained so that a transversal component in relation to the longitudinal component of the net magnetization is generated. After termination of the RF pulse the relaxation process of the longitudinal and reversal components of the net magnetization begin until the net magnetization has returned to its equilibrium state. Magnetic resonance signals, which are generated by the processing magnetization are detected by means of the RF receiver coil 6. The received magnetic resonance signals are time-based amplitude signals, which are further Fourier transformed to frequency-based magnetic resonance spectrum signals and further processed for generating a magnetic resonance image of the nucleons of interest.

Figure 2:
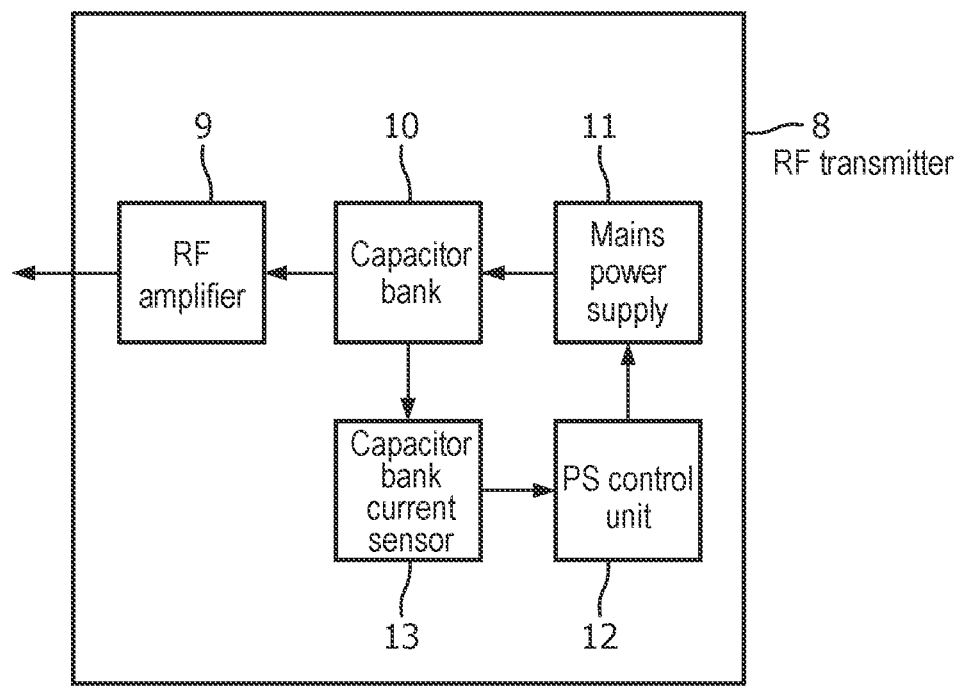
Figure 3:
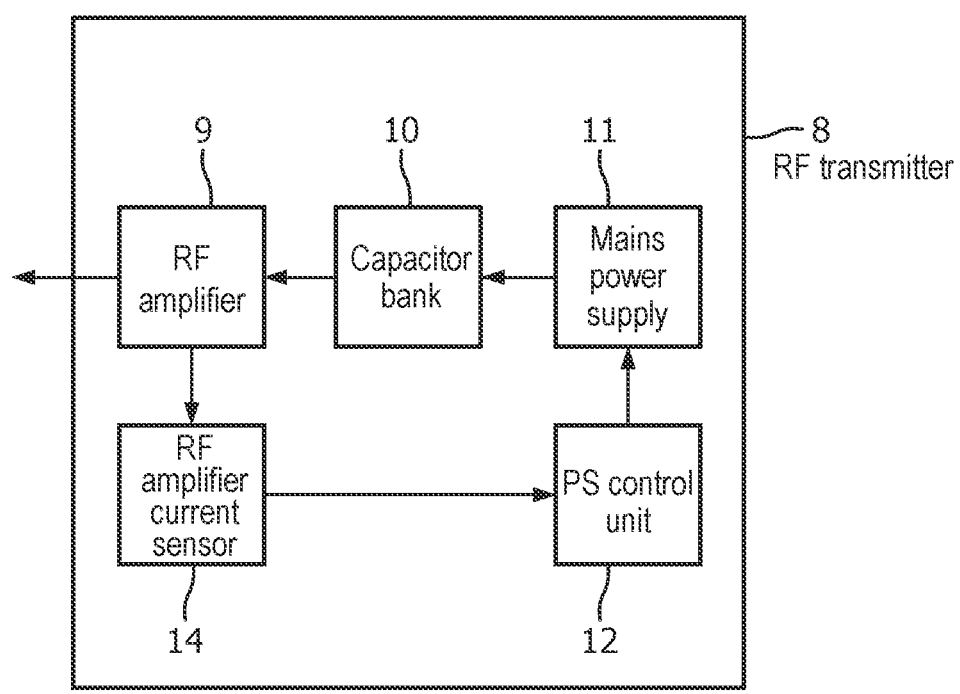

According to the first preferred embodiment of the invention described here, a RF transmitter 8 is provided, which is schematically depicted in FIG. 2 in more detail. The RF transmitter 8 comprises a RF amplifier 9 for generating RF pulses and for forwarding these RF pulses to the RF transmit coil 5 of the MRI system 1. Further, the RF transmitter 8 comprises a capacitor bank 10, which is coupled to the RF amplifier 9, for storing electric energy and for providing the RF amplifier 9 with a current for generating the RF pulses. A mains power supply 11 is coupled to the capacitor bank 10, for generating a charging current for charging the capacitor bank 10 with electric energy.

It is an essential aspect of the first preferred embodiment of the invention that a power supply control unit 12 is coupled to the mains power supply 11, for controlling the generation of the charging current for the capacitor bank 10. The generation of the charging current for the capacitor bank 10 is controlled in such a way that the power supply control unit 12 receives an indication signal indicating the actual current drawn from the capacitor bank 10 and for controlling the generation of the charging current for the capacitor bank 10 on the basis of this indication signal. This indication signal is generated by a capacitor bank current sensor 13, which is coupled to the capacitor bank 10 and which measures the actual current drawn from the capacitor bank 10 and, on the basis of the measured current, generates the indication signal, which is forwarded to the power supply control unit 12. Hence, the control of the charging current fed from the mains power supply 11 to the capacitor bank 10 is directly governed by the actual current drawn from the capacitor bank 10. Therefore, the actual current drawn from the capacitor bank 10 directly triggers a respective recharging of the capacitor bank 10 by the mains power supply 11.

According to an alternative second preferred embodiment of the invention, instead of measuring the current drawn from the capacitor bank 10, a RF amplifier current sensor 14 is provided, which is coupled to the RF amplifier 9. The RF amplifier current sensor 14 measures the actual current used in the RF amplifier 9 for generating the RF pulses. On the basis of this current, the RF amplifier current sensor 14 generates the indication signal, which is sent to the power supply control unit 12 for controlling the generation of electric energy in the mains power supply 11. Hence, according to the second preferred embodiment of the invention, the actual current used in the RF amplifier 9 triggers the recharging of the capacitor bank 10.

It is to be noted that though the second preferred embodiment of the invention here is described as an alternative to the first preferred embodiment of the invention described before, the options according to the first and second preferred embodiments, respectively, may also be combined. This means that the RF transmitter 8 may be provided with a capacitor bank current sensor 13 as well as a RF amplifier current sensor 14 for generating signals indicative of the required current in the RF transmitter 8 and, hence, for a respective recharging of the capacitor bank 10 by the mains power supply 11, which is controlled by the power supply control unit 12.

Figure 4:
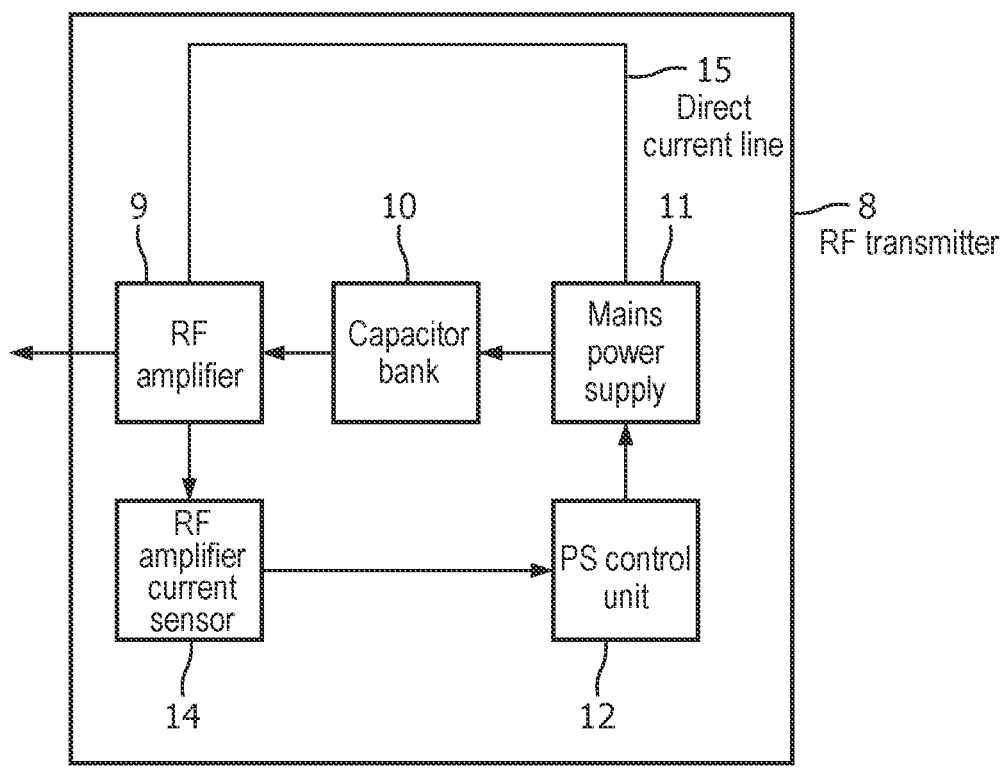

FIG. 4 schematically depicts a RF transmitter 8 according to a third preferred embodiment of the invention. This third preferred embodiment of the invention resembles the second preferred embodiment of the invention described before wherein in addition to the charging of the RF amplifier 9 by the capacitor bank 10 a direct charging of the RF amplifier 9 by the mains power supply 11 is possible due to a direct current line 15 between the mains power supply 11 and the RF amplifier 9. Hence, not only the current from the capacitor bank 10 but also the current, which is directly obtained from the mains power supply 11 may be used to generate RF power, which allows for a smaller capacitor bank 10 at the same performance level.

Figure 5:
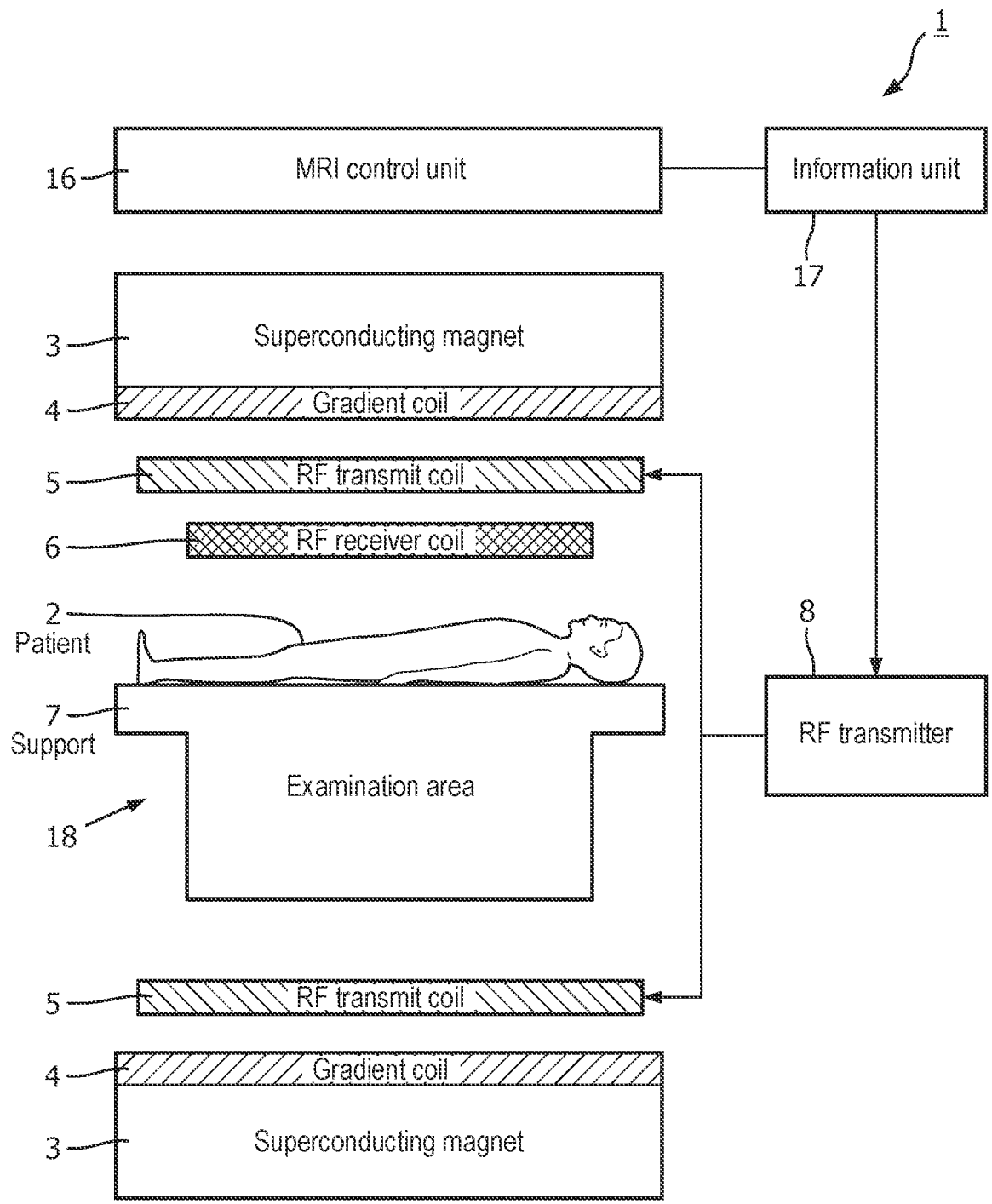
Figure 6:
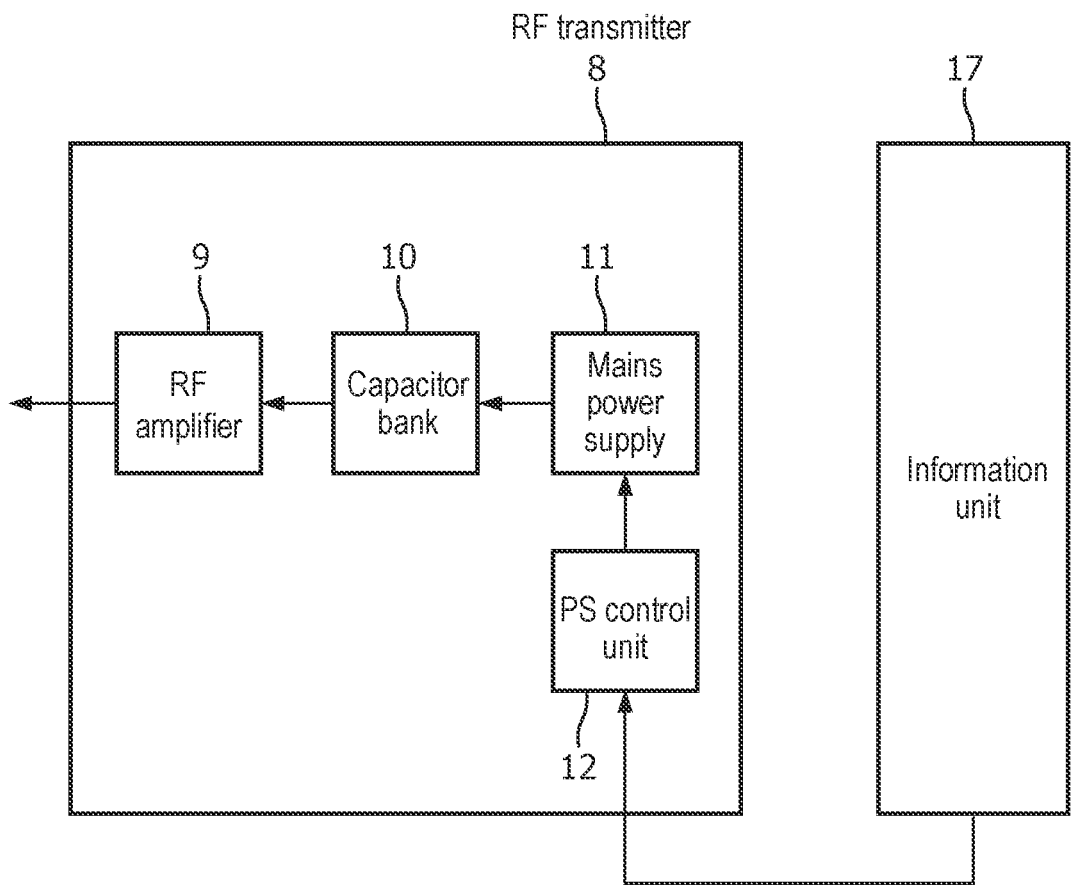

In FIG. 5 a MR system 1 according to a fourth preferred embodiment is shown. As commonly known for MRI systems, also the present MRI system 1 according to the fourth preferred embodiment of the invention is controlled by a MRI control unit 16, which is omitted in FIG. 1 but explicitly depicted in FIG. 5. This MRI control unit 16 is coupled to an information unit 17, which is further coupled to the RF transmitter 8 according to the fourth preferred embodiment of the invention. This RF transmitter 8 is depicted in more detail in FIG. 6. From FIG. 6 it can be seen that the information unit 17 is coupled to the power supply control unit 12. Actually, the information unit 17 receives information from MRI control unit 16 about the MRI process performed by the MRI system 1. In this way, the information unit 17 generates an indication signal on the basis of the upcoming current drawn from the capacitor bank 10 on the basis of the upcoming RF power demand for the transmit coil 5 of the MRI system, which is fed to the information unit 17 by the MRI control unit 16. In this way, it is even possible to feed a charging current to the capacitor bank 10 directly before a RF pulse is generated and forwarded to the RF transmit coil 5. Thus, this embodiment makes it possible to prevent conceivable drops in available RF power on the basis of the planned MRI process, which is executed by the MRI system 1.

Altogether, the present invention addresses the power supply control for the RF amplifier 9 of the RF transmitter 8 of a MRI system 1 by using extra information on required charging current for the capacitor bank 10. This information is used to activate the recharging of the capacitor bank 10 in time and in some cases even before a RF energy drop has occurred. In this way, the generation of RF pulses for MRI applications becomes more efficient making it possible to use smaller capacitor bank values at the same performance level of the system.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope. Further, for the sake of clearness, not all elements in the drawings may have been supplied with reference signs.

REFERENCE SYMBOL LIST

MRI system 1
patient 2
superconducting magnet 3
gradient coil 4
RF transmit coils 5
RF receiver coil 6
patient support 7
RF transmitter 8
RF amplifier 9
capacitor bank 10
mains power supply 11
power supply control unit 12
capacitor bank current sensor 13
RF amplifier current sensor 14
current line 15
MRI control unit 16
information unit 17
examination area 18

The invention claimed is:

1. A magnetic resonance imaging (MRI) system with a RF transmit coil and an RF transmitter, the system comprising:
an RF amplifier configured to generate RF pulses and to forward these RF pulses to the RF transmit coil of the MRI system,
a capacitor bank coupled to the RF amplifier (9), wherein the capacitor bank is configured to store electric energy and for providing the RF amplifier with a current for generating the RF pulses,
a mains power supply coupled to the capacitor bank, the mains power supply configured to generate a charging current for charging the capacitor bank with electric energy, and
a power supply control unit coupled to the mains power supply, the power supply control unit configured to control the generation of the charging current for the capacitor bank, wherein
an information unit is coupled to the power supply control unit and being adapted for generating an indication signal on the basis of an upcoming current drawn from the capacitor bank on the basis of an upcoming RF power demand for the transmit coil of the MRI system and
the power supply control unit is configured to receive the indication signal indicating the upcoming current drawn from the capacitor bank and for controlling the generation of the charging current for the capacitor bank on the basis of the indication signal.

2. The MRI system with the RF transmitter according to claim 1, further comprising:
a capacitor bank current sensor coupled to the capacitor bank and being adapted for measuring the actual current drawn from the capacitor bank and for generating the indication signal on the basis this current.

3. The MRI system with the RF transmitter according to claim 1, further comprising:
a RF amplifier current sensor coupled to the RF amplifier and being adapted for measuring the actual current used in the RF amplifier for generating the RF pulses and for generating the indication signal on the basis this current.

4. The MRI system with the RF transmitter according to claim 1, wherein the RF amplifier is also directly coupled to the mains power supply for directly drawing a current from the mains power supply.

5. The MRI system with the RF transmitter according to claim 1, wherein the mains power supply is a switched mode power supply.

6. A method for generating RF pulses for a magnetic resonance imaging (MRI) system with a RF transmitter, the RF transmitter comprising a mains power supply, a capacitor bank and a RF amplifier, the method comprising the following method steps:
generating a charging current in the mains power supply and charging the capacitor bank with the charging current,
providing the RF amplifier with a current from the capacitor bank for generating the RF pulses,
generating RF pulses in the RF amplifier and forwarding these RF pulses to a RF transmit coil of the MRI system,
estimating the actual and/or the upcoming current drawn from the capacitor bank, and
controlling the generation of the charging current for the capacitor bank in the mains power supply based on the estimated actual and/or the upcoming current drawn from the capacitor bank.

7. The method according to claim 6, further comprising:
controlling the generation of the charging current for the capacitor bank based on the estimated upcoming current drawn from the capacitor bank in such a way that a charging current is fed to the capacitor bank directly before a RF pulse is generated and forwarded to the RF transmit coil.

8. The method according to claim 7, comprising the additional step of
estimating the actual current drawn from the capacitor bank by measuring the actual current drawn from the capacitor bank.

9. The method according to claim 6, further comprising:
estimating the actual current drawn from the capacitor bank by measuring the actual current used in the RF amplifier.

10. The method according to claim 6, wherein the RF amplifier is also directly fed by a charging current from the mains power supply.

11. The method according to claim 6, further comprising:
estimating the upcoming current drawn from the capacitor bank on the basis of the upcoming RF power demand for the RF transmit coil of the MRI system.

12. A non-transitory computer-readable medium, comprising instructions stored thereon, that when executed on a processor, induce a MRI system to perform a method according to claim 6.

* * * * *